US005726654A

United States Patent [19]

Hatae et al.

[11] Patent Number: 5,726,654
[45] Date of Patent: Mar. 10, 1998

[54] ANALOG TO DIGITAL CONVERTER AND SIGNAL CONVERSION EQUIPMENT USING THE SAME

[75] Inventors: Hiroshi Hatae, Toda; Hajime Akimoto, Ome, both of Japan

[73] Assignee: Hitachi, Ltd., Tokyo, Japan

[21] Appl. No.: 562,186

[22] Filed: Nov. 22, 1995

[30] Foreign Application Priority Data

Nov. 25, 1994 [JP] Japan .................................... 6-290937

[51] Int. Cl.$^6$ .................................................. H03M 1/38
[52] U.S. Cl. .......................................................... 341/161
[58] Field of Search .................................. 341/161, 155, 341/172; 250/578

[56] References Cited

U.S. PATENT DOCUMENTS 4,734,589 3/1988 Atherton ................................ 250/578

*Primary Examiner*—Brian K. Young
*Attorney, Agent, or Firm*—Antonelli, Terry, Stout, & Kraus, LLP

[57] ABSTRACT

An analog to digital converter capable of compensating characteristic unevenness of a signal amplification unit provided at a foregoing part of an analog to digital conversion unit and a signal conversion apparatus using the analog to digital converter are disclosed. An input signal is inputted to an analog to digital conversion unit after being converted from a first physical quantity into a second physical quantity by a signal processing unit. Further, a standard signal is converted from the first physical quantity into the second physical quantity by another or the same processing unit having the same function and is inputted to the analog to digital conversion unit. In the analog to digital conversion unit, analog to digital conversion is performed using the standard signal converted into this second physical quantity.

18 Claims, 18 Drawing Sheets

ANALOG TO DIGITAL CONVERTER AND SIGNAL CONVERSION EQUIPMENT USING THE SAME

BACKGROUND OF THE INVENTION

The present invention relates to an analog to digital converter in which an input signal is inputted through a signal processing means having a physical quantity conversion function and an amplification function. The present invention further relates to signal conversion equipment such as photoelectric conversion equipment using such on analog to digital conversion. VTR integrated cameras or the like that converts light into an electric signal are now widespread. In such cameras, a solid state image sensor discharges its duties for converting light entering through a lens into an electric signal. The output signal of this solid state image sensor is an analog signal, and an output signal of the solid state image sensor is converted normally into a digital signal by an analog to digital converter since signal processing inside a camera digital signal processing. It is disclosed in JP-A-62-154981, for instance, that a plurality of analog to digital converters are used inside a solid state image sensor. A conceptual diagram of this analog to digital converter is shown in FIG. 19. In this case, signal charge, which is a first physical quantity, is inputted to a first signal processing means 10 and converted into a signal voltage, which is a second physical quantity, and then the signal voltage is inputted to an analog to digital conversion means 110. Further, a standard signal when analog to digital conversion is performed is inputted as voltage to the analog to digital conversion means 110 from an external terminal 112, and analog to digital conversion is performed using this standard voltage.

SUMMARY OF THE INVENTION

In the prior art described above, since a standard signal is applied from the outside as voltage, the standard voltage applied from the outside has to be regulated for each chip when characteristics of the first signal processing means 10 vary for each chip. Moreover, when a plurality of analog to digital converters are provided in the same chip, an analog to digital conversion error is generated due to unevenness in respective signal processing means of the analog to digital converters.

It is an object of the present invention to provide an analog to digital converter that is not influenced by unevenness of characteristics of the signal processing means described above and a signal conversion equipment using such an analog to digital converter.

The above-mentioned object is achieved by an analog to digital converter having a first signal processing means for converting an input signal having a first physical quantity into a second physical quantity different from the first physical quantity and outputting an analog signal while providing gain to the input signal and an analog to digital conversion means for converting the analog signal into a digital signal using a second standard signal having the second physical quantity, having a second signal processing means having substantially the same function as that of the first signal processing means described above and using a first standard signal having the first physical quantity as an input signal and the second standard signal as an output signal, and by signal conversion equipment using the analog to digital converter.

With this, when characteristics of the first signal processing means vary and the input signal of the analog to digital conversion means deviates from a design range, it is possible to supply a standard signal that has similarly deviated from the second signal processing means. Therefore, no analog to digital conversion error is generated. This is due to that a fact that the same characteristic is always obtainable because the first signal processing means and the second signal processing means have the same structure.

Besides, an energy beam such as light, X-rays and charged particle beam, pressure, wind velocity, flow rate or the like may be mentioned as the first physical quantity, which, however, are not limited thereto. The second physical quantity is voltage.

DETAILED DESCRIPTION OF THE PREFERRED EMBODIMENTS

<Embodiment 1>

Figure 1:
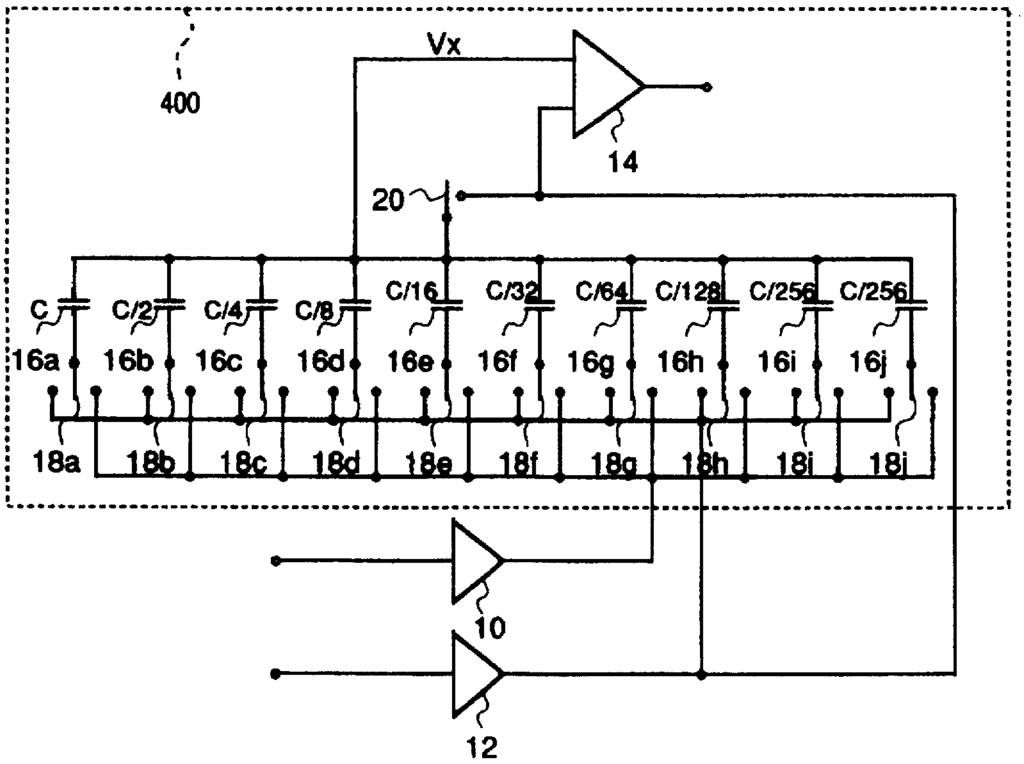
FIG. 1 is a schematic diagram of an analog to digital converter of Embodiment 1 according to the present invention.

Embodiments of the present invention will be described in detail hereunder. FIG. 1 shows an embodiment of an analog to digital converter according to the present invention, in which a charge reallocation type successive approximation system in 9 bits is realized. Here, a reference numeral 10 represents a first signal processing means in which an input is electric charge (a first physical quantity) and an output is voltage (a second physical quantity), 12 represents a second signal processing means in which an input is electric charge (the first physical quantity) and an output is voltage (the second physical quantity), and 14 represents a voltage comparison means and compares the output of the second signal processing means 12 with the voltage at a terminal Vx where respective capacitor arrays are connected. Further, 16a to 16j represent weighted capacitor array. An analog to digital conversion means 400 is composed of the capacitor array and voltage comparison means.

An electric charge reallocation type successive approximation system in which standard voltage is applied from the outside using a weighted capacitor array is well known, but the present embodiment is featured by canceling unevenness among chips or that of signal processing means inside a chip by applying a standard signal with electric charge which is the same physical quantity as an input signal.

When analog to digital conversion in 9 bits is performed for instance, a weighted capacitor array which consists of ten capacitors 16a to 16j having respective capacities of $C/2^0$ to $C/2^8$, $C/2^8$ (C to C/256, C/256) is used. In this way, a capacity ratio of 1 to the (n−1)th power becomes necessary in this capacitor array when analog to digital conversion in n bits is performed. Further, 18a to 18j represent switches for switching terminals of respective capacitors for changing over the output of the first signal processing means 10 to and from the output of the second signal processing means 12. Further, 20 represents a switch for switching other terminals of respective capacitors for changing over the state of floating with the output of the second signal processing means 12.

Figure 2:
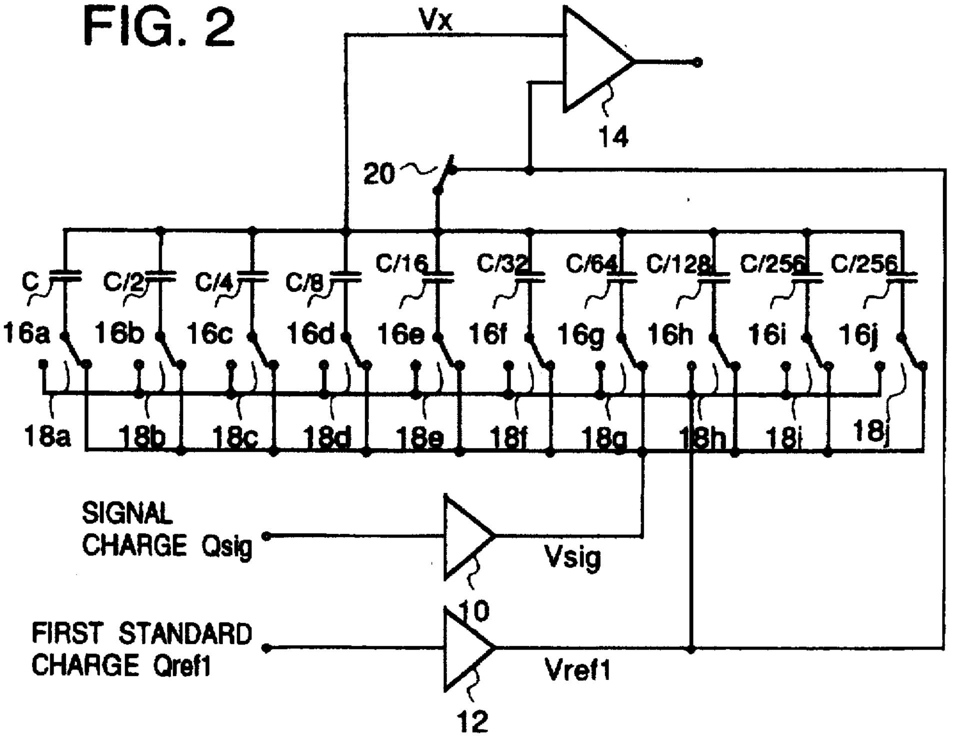
FIG. 2 is a schematic diagram of a circuit for explaining the operation of the analog to digital converter in the Embodiment 1.

Next, the operation will be described. First, as shown in FIG. 2, a signal charge Qsig is inputted to an input of the first signal processing means 10, and a first standard charge Qref1 for determining standard voltage on a lower side when analog to digital conversion is performed is inputted to an input of the second signal processing means 12.

Figure 23:
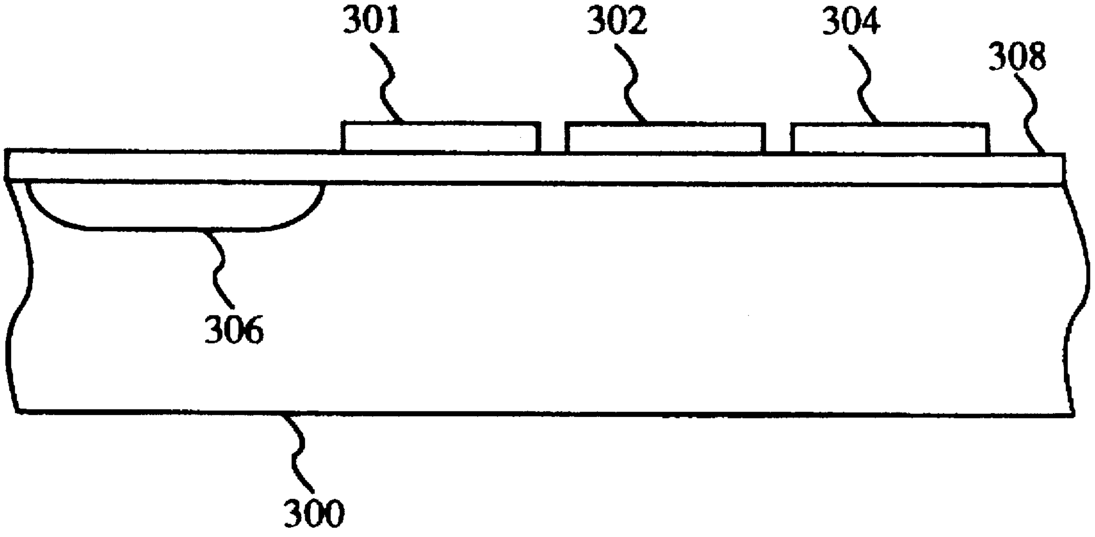
FIG. 23 is a schematic diagram for explaining an example of standard charge generating means.

Besides, an example of a method of generating the first standard charge will be described with reference to FIG. 23. There are provided three standard charge generating electrodes, i.e., a first standard charge generating electrode 301, a second standard charge generating electrode 303 and a third standard charge generating electrode 304, and an n-type diffused layer 306 capable of controlling electric potential by a signal line (not shown) next the first standard charge generating electrode 301 on a semiconductor substrate 300 through an oxidized film 308. First, the electric potential of the first and the second standard charge generating electrodes is set higher than the electric potential of the diffused layer 306, whereby to accumulate electrons under the first and the second standard charge generating electrodes. At this time, the third standard charge generating electrode 304 forms a potential barrier so that electrons do not flow away. Then, the first standard charge generating electrode 301 is controlled keeping the voltage applied to the second and the third standard charge generating electrodes 302 and 304 as it is so as to form a potential barrier for separating the diffused layer 306 and the second and the third standard charge generating electrodes 302 and 304 from each other. With this, electric charges that become standard charge are accumulated under the second standard charge generating electrode (a well for electrons formed by the first and the third standard charge generating electrodes). These electrons are transferred to a location required and utilized there.

It is also possible to use other physical quantity such as light in order to generate the standard charge.

Figure 3:
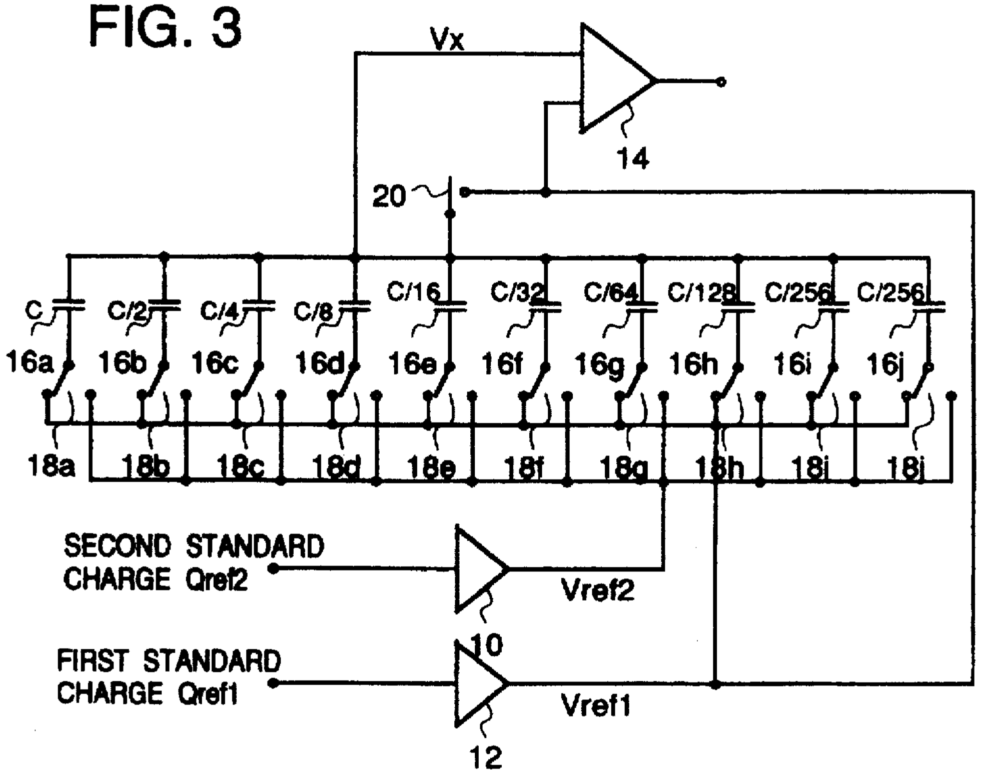
FIG. 3 is a schematic diagram of a circuit for explaining the operation of the analog to digital converter in the Embodiment 1.

In accordance with the input signal, a signal voltage Vsig is outputted from the first signal processing means 10, and first standard voltage Vref1 on a low side when analog to digital conversion is performed is outputted from the second signal processing means 12. The switch 20 is closed in this state so as to connect the switches 18a to 18j to the output of the first signal processing means 10. With this, electric charges corresponding to a potential difference between the first standard voltage Vref1 and the signal voltage Vsig are stored in respective capacitors. That is, electric charges constituting the input signal are divided and stored in the capacitor array constituting bits. Next, the switch 20 is opened as shown in FIG. 3 and the switches 18a to 18j are connected to the output of the second signal processing means 12. With this, voltage at a node Vx drops from the first standard voltage Vref1 by a portion of potential difference between the signal voltage Vsig and the first standard voltage Vref1. In a word, the voltage on the side connected to the node Vx is lower by the portion of the difference between the signal voltage Vsig and the first standard voltage Vref1 in a voltage comparison means 14 in this state. Next, a second standard charge Qref2 for determining standard voltage on a higher side when analog to digital conversion is performed is inputted to the first signal processing means 10. In accordance with this input, second standard voltage Vref2 on a low side when analog to digital conversion is performed is outputted from the first signal processing means 10.

Figure 4:
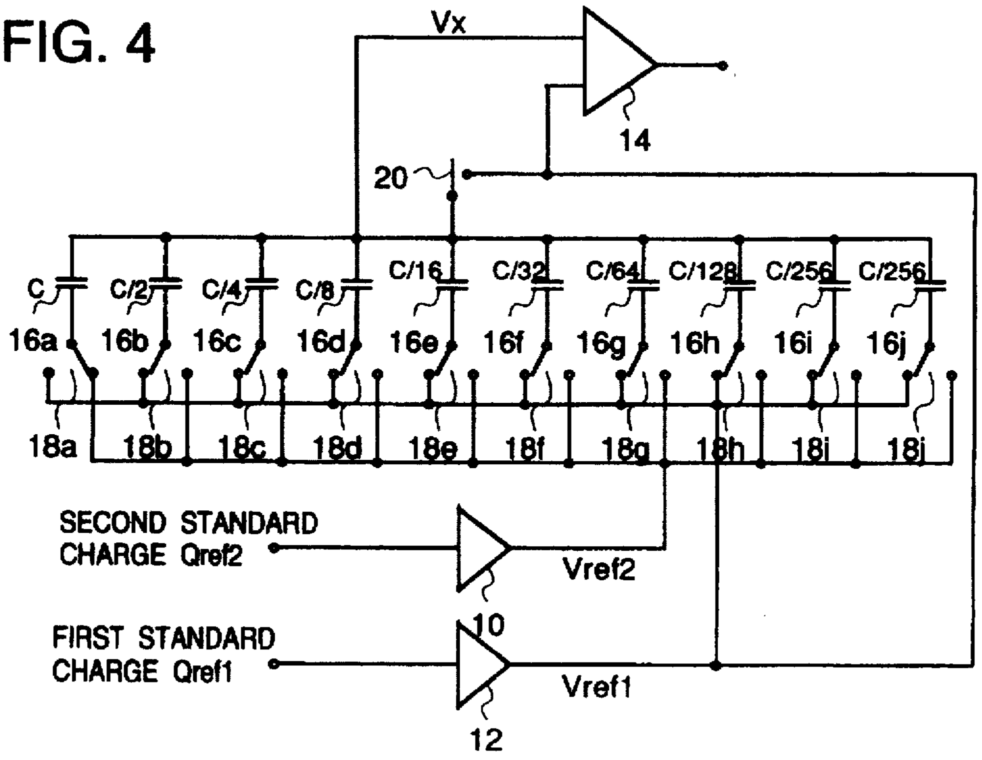
FIG. 4 is a schematic diagram of a circuit for explaining the operation of the analog to digital converter in the Embodiment 1.

The operation for determining the most significant bit by using a capacitor 16a is started in this state. It is described with reference to FIG. 4. First, the switch 18a is connected to the output of the first signal processing means 10. With this, a capacity value C in the whole capacity value 2C of the capacitor array is connected to the second standard voltage Vref2 that is the output of the first signal processing means 10, and the remaining capacity value C is connected to the first standard voltage Vref1 that is the output of the second signal processing means 12. In a word, the voltage is raised at the node Vx by half the voltage of the potential difference between the second standard voltage Vref2 and the first standard voltage Vref1. At this time, when the voltage at the node Vx rises higher than the first standard voltage Vref1 which is one input of the voltage comparison means 14, it means that the previously inputted signal voltage Vsig is lower than intermediate voltage between the second standard voltage Vref2 and the first standard voltage Vref1, thus making it possible to determine that the most significant bit is "0". In contrast with this, when the voltage of the node Vx is lower than the first standard voltage Vref1, it is possible to determine that the most significant bit is "1". Further, when the bit obtained as the result of determination is "0", the switch 18a is changed over to the output of the second signal processing means 12, and when the bit obtained as the result of determination is "1", the switch 18a is kept in the state as it is, and the operation for determining the next bit is started using the switch 18b this time. In the present embodiment, such an operation is repeated from the capacitor 16a determining the most significant bit to a capacitor 16i determining the least significant bit, thereby to obtain analog to digital conversion data in 9 bits.

In the present embodiment, the first standard voltage Vref1 and the second standard voltage Vref2 that become standard signals for analog to digital conversion are generated using the first standard charge Qref1 and the second standard charge Qref2, respectively. Accordingly, when analog to digital conversion in 10 bits for instance is performed, it is possible to absorb unevenness between chips of the first signal processing means 10 when the first signal processing means 10 and the second signal processing means 12 are produced in close vicinity to each other so that the characteristic error becomes ½ of or less than the tenth power of ½ of the input voltage, in other words, half of the voltage of one least significant bit (LSB) or less so as to obtain same characteristics.

This is because of such a reason that, in the present embodiment, either when a plurality of analog to digital converters are provided on the same chip or when characteristic of the signal processing means varies, it is possible to cancel characteristic unevenness by supplying the standard voltage generated from the same standard voltage generator to these signal processing means.

A case of the voltage comparison means 14 having two input terminals has been described in the present embodiment. As to this voltage comparison means, however, a chopper type comparator may be used by switching the node Vx and the output of the second signal processing means 12 over to each other. With this, it becomes possible to attain lower power consumption.

<Embodiment 2>

Figure 5:
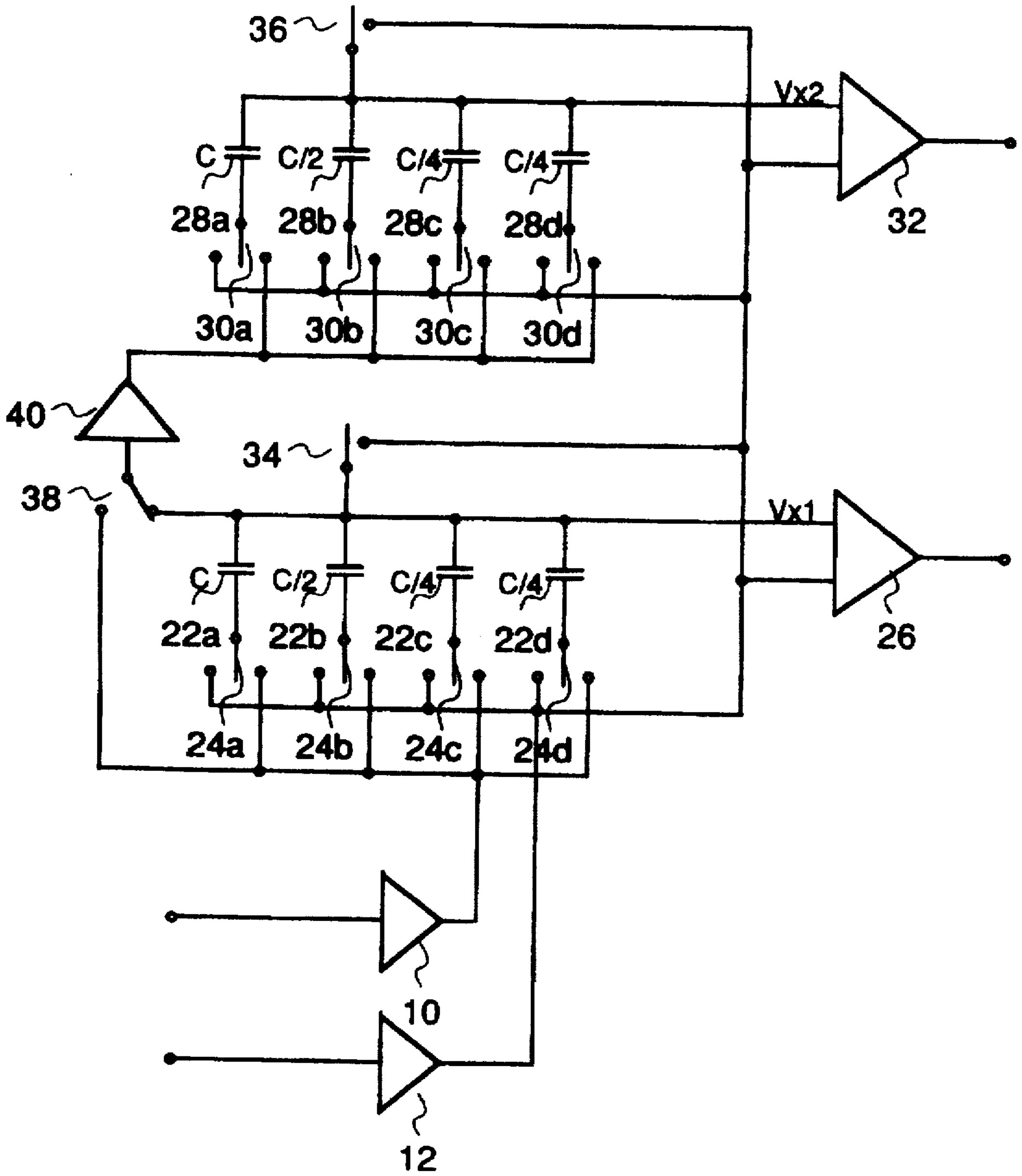
FIG. 5 is a schematic diagram of an analog to digital converter of Embodiment 2 according to the present invention.

Next, an embodiment in which the whole capacity value required for the capacitor array has been curtailed will be described with reference to FIG. 5. The present embodiment is featured by that two sets of capacitor arrays for upper bits and lower bits are produced and analog to digital conversion is performed in two times separately. Here, 22a to 22d represent a capacitor array for analog to digital conversion of upper bits, and 24a to 24d represent switches for switching terminals of respective capacities for analog to digital conversion of upper bits so as to change over the output of the first signal processing means 10 to and from the output of the second signal processing means 12. Further, 34 represents a switch for connecting respective capacitors for analog to digital conversion of upper bits to the output of the second signal processing means 12. Further, 28a to 28d represent a capacitor array for analog to digital conversion of lower bits, and 30a to 30d represent switches for switching terminals of respective capacitors for analog to digital conversion of lower bits so as to change over the output of the first signal processing means 10 to and from the output of the second signal processing means 12. 36 represents a switch for connecting respective capacitors for analog to digital conversion of lower bits to the output of the second signal processing means 12. Further, 26 represents a voltage comparison means for upper bits, which compares the output of the second signal processing means 12 with the voltage at a node Vx1 where respective capacity arrays for upper bits are connected. Further, 32 represents a voltage comparison means for lower bits, which compares the output of the second signal processing means 12 with the voltage at a terminal Vx2 where respective capacity arrays for higher bits are connected. Finally, 40 represents a buffer for transmitting the electric potential at the node Vx1 to the capacitor array 28a to 28d for analog to digital conversion of lower bits.

Figure 6:
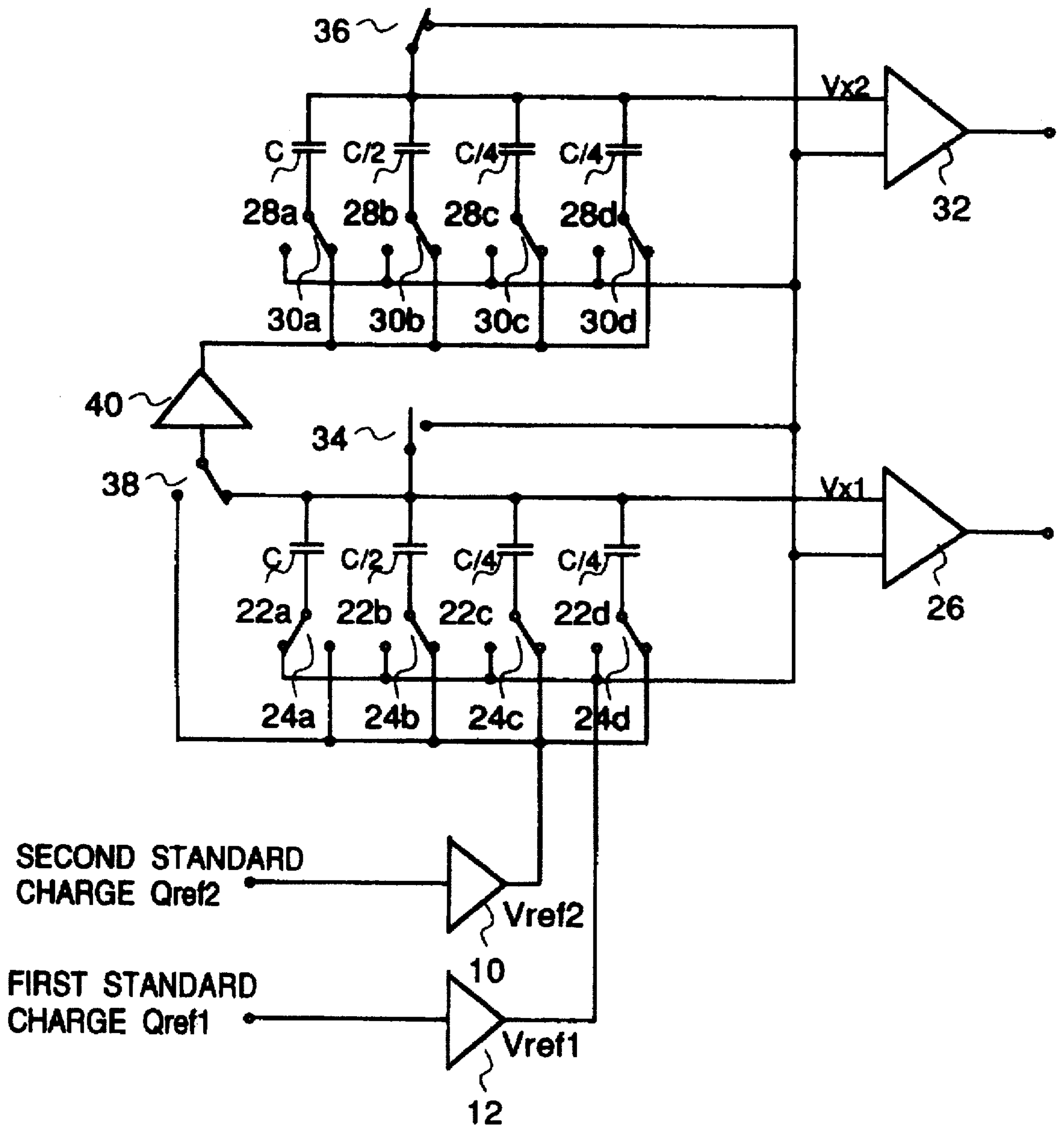
FIG. 6 is a schematic diagram of a circuit for explaining the operation of the analog to digital converter of the Embodiment 2.

Next, the operation will be described. First, analog to digital conversion of three upper bits is performed by a method similar to that in the Embodiment 1 using the capacity array 22a to 22d for analog to digital conversion of upper bits, switches 24a to 24d, the voltage comparison means 26 for upper bits and the switch 34. The state at the point of time when analog to digital conversion of three upper bits is completed is shown in FIG. 6. At this time, residual voltage for performing analog to digital conversion of lower bits has been generated at the node Vx1. First, a switch 38 is connected to a lower bit capacitor array side, and this voltage is applied so as to charge the capacitor array 28a to 28d for analog to digital conversion of lower bits through the buffer 40.

Figure 7:
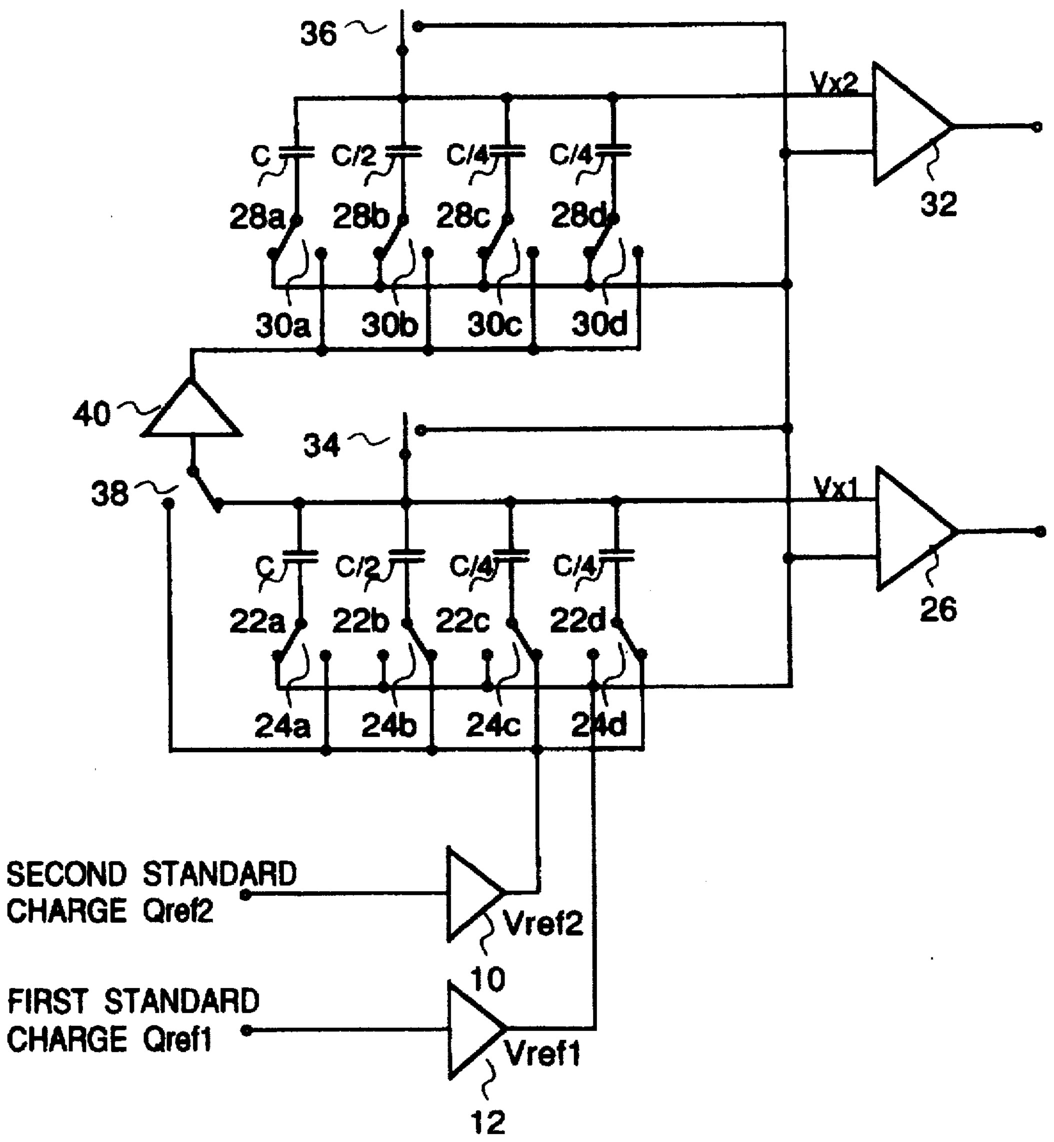
FIG. 7 is a schematic diagram of a circuit for explaining the operation of the analog to digital converter of the Embodiment 2.

Then, in a similar manner as shown in the Embodiment 1, a switch 36 is opened and switches 30a to 30d are connected to the output side of the second signal processing means as shown in FIG. 7.

Figure 8:
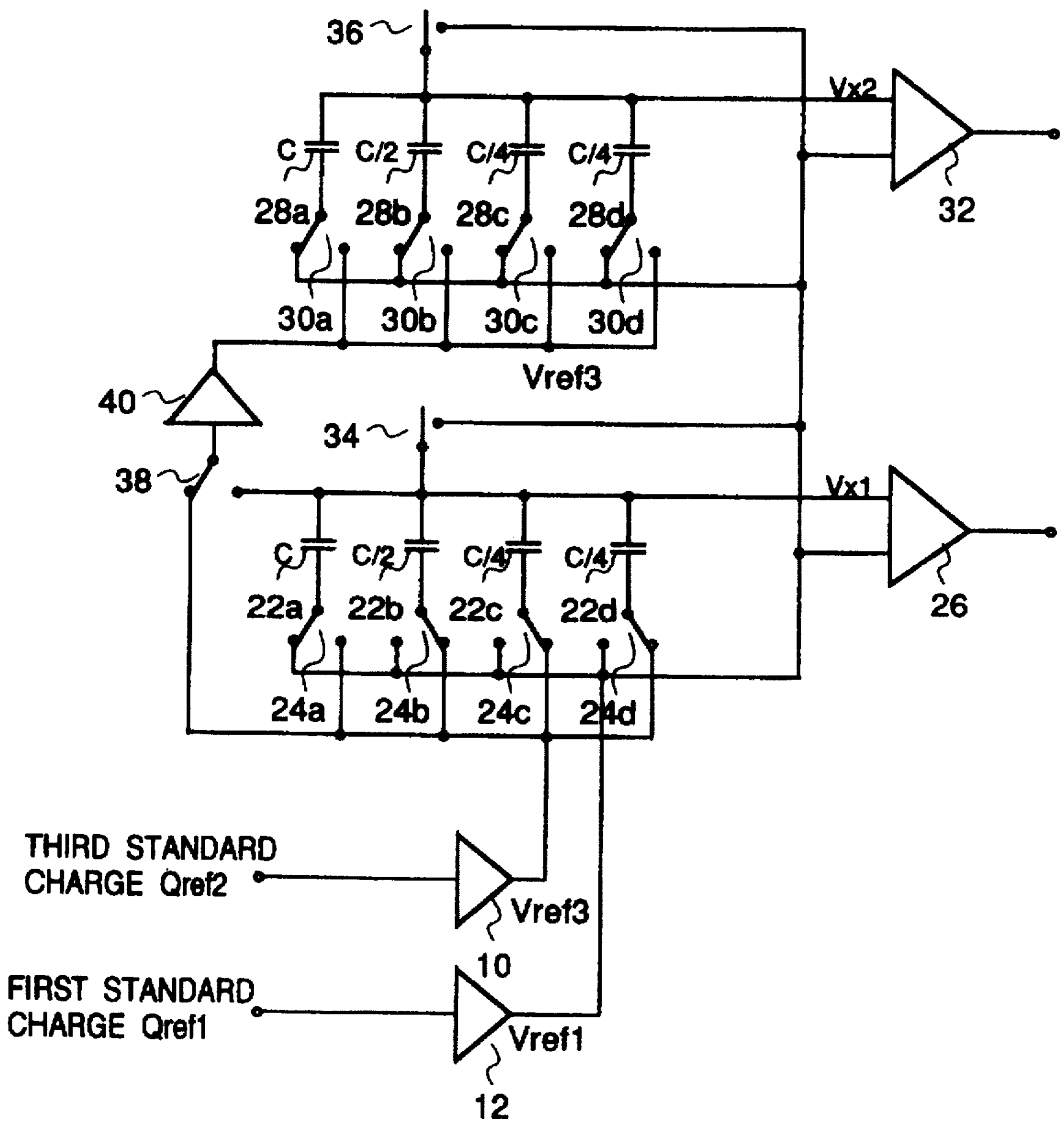
FIG. 8 is a schematic diagram of a circuit for explaining the operation of the analog to digital converter of the Embodiment 2.

Next, as shown in FIG. 8, standard charge Qref3 for converting lower bits is inputted to the first signal processing means 10. When analog to digital conversion is performed while separating at three upper bits, the standard charge Qref3 is set to a charge quantity which is ⅛ of the standard charge Qref1. Then, the switch 38 is switched to the output side of the first signal processing means 10, and the third standard voltage Vref3 generated by the standard charge Qref3 is switched successively by means of switches 30a to 30d, thus performing analog to digital conversion of three lower bits.

With this structure, when it is desired to perform 6-bit conversion for instance, the capacity value required for the capacitor array can be reduced, when it is assumed that the unit capacity is C, from two times of the (n−1)th power of C to two times of the ((n−1)/2)th power of C. This becomes more effective as the number of conversion bits is increased.

Further, when a well-known charge reallocation analog to digital conversion system is structured using a plurality sets of capacitor arrays as in the present embodiment, adjustment becomes necessary when the buffer 40 varies since standard voltage for analog to digital conversion is supplied in voltage from the outside. According to the present invention, however, the standard for analog to digital conversion is given with electric charge and standard voltage is generated through the buffer 40, thus making it possible to absorb unevenness of the buffer 40.

A structure composed of two sets of capacitor arrays has been described in the present embodiment, but it is not necessarily limited to two sets. Although conversion period of time gets longer when the number of sets is increased, it is possible to make the whole capacity value smaller.

<Embodiment 3>

Figure 9:
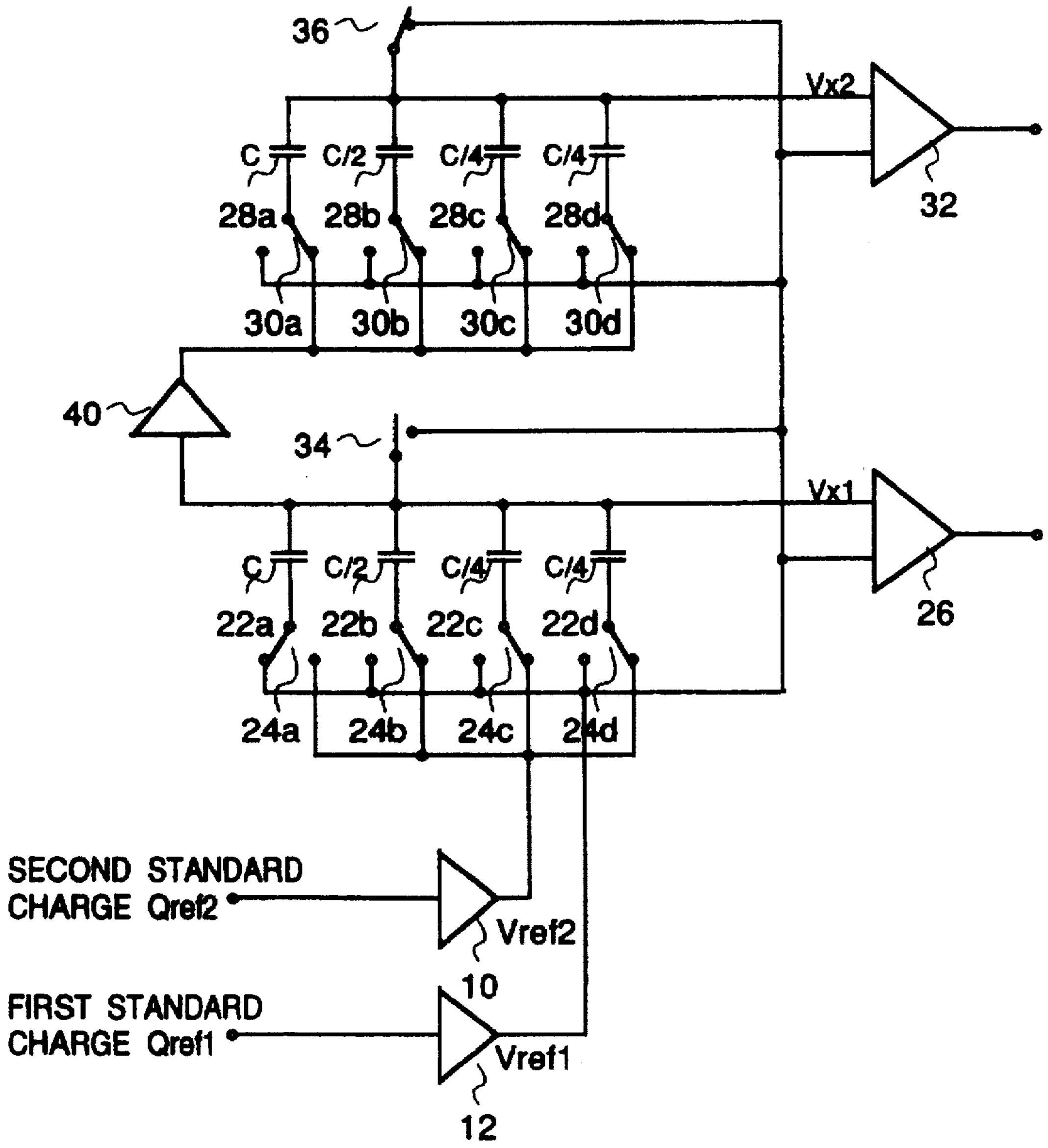
FIG. 9 is a schematic diagram of a circuit for explaining the operation of an analog to digital converter of Embodiment 3.

Next, an embodiment in which third standard voltage used in analog to digital conversion of lower bits is generated using the capacitor array for upper bits will be described with reference to FIG. 9. The present embodiment is featured by that the switch 38 in the Embodiment 2 is not required. FIG. 9 shows a state that analog to digital conversion of upper bits using the capacitor array 22a to 22d has been completed and the voltage at the V node Vx1 has been inputted to the capacitor array 28a to 28d of lower bits.

Figure 10:
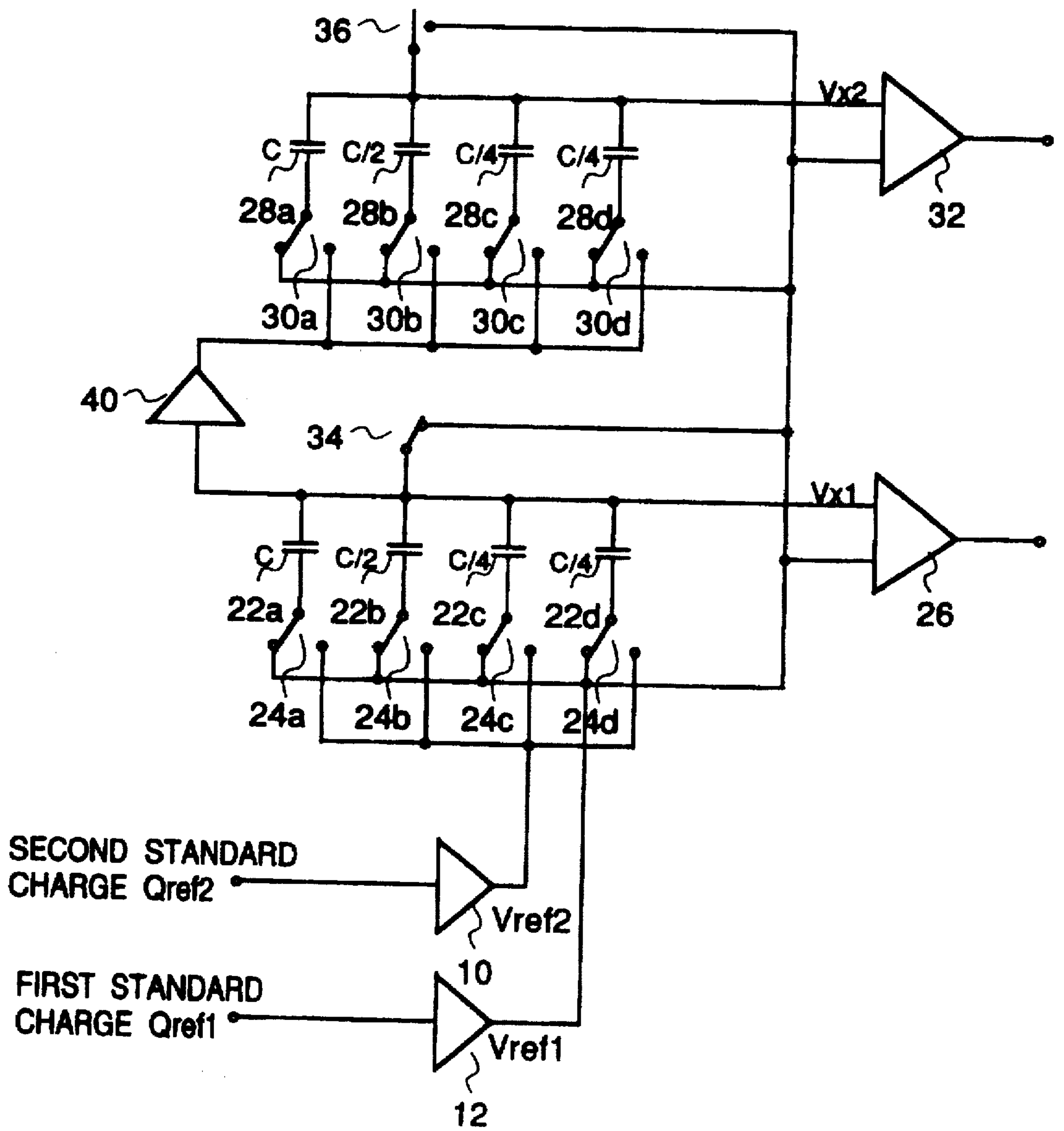
FIG. 10 is a schematic diagram of a circuit for explaining the operation of the analog to digital converter of the Embodiment 3.
Figure 11:
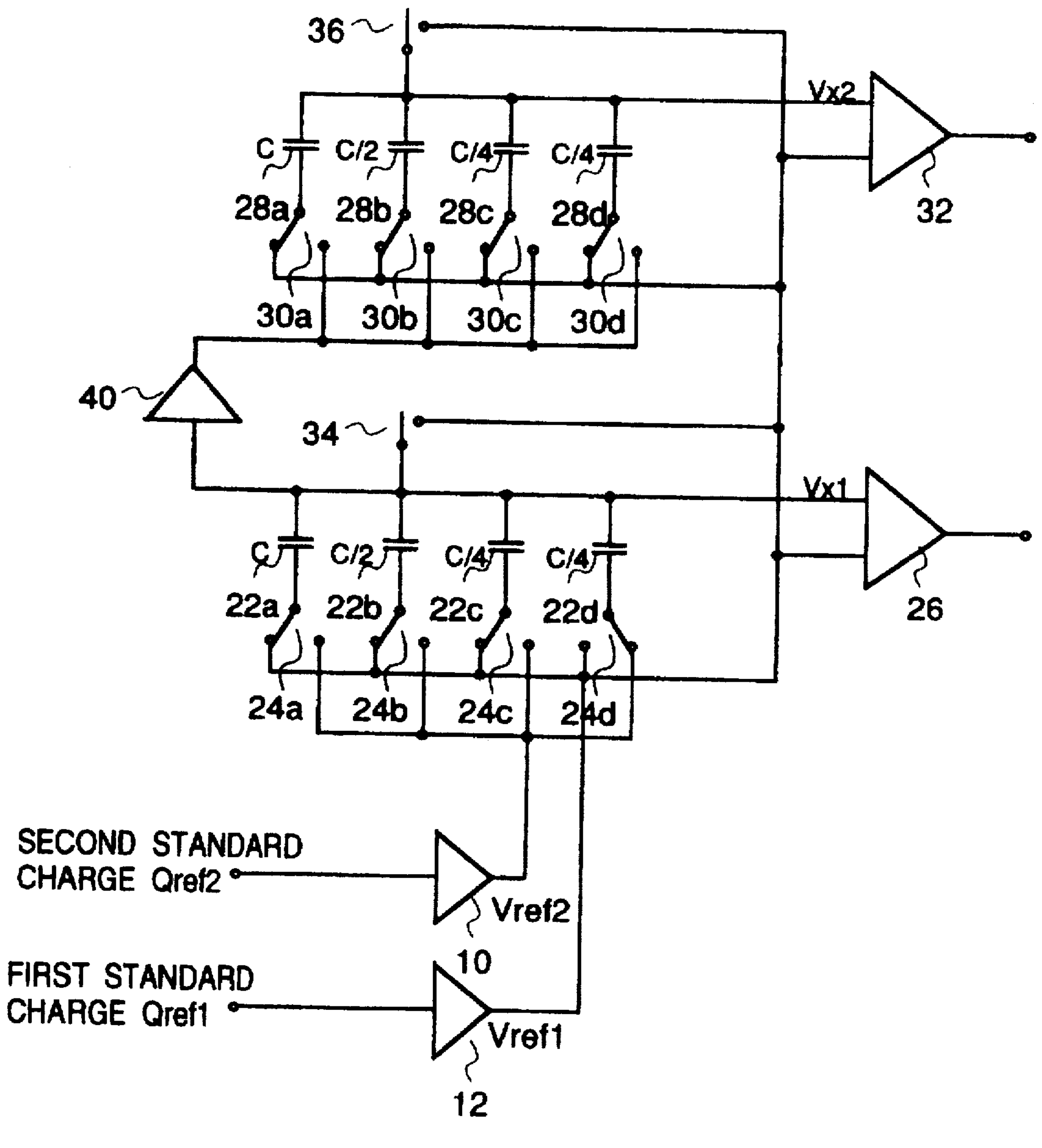
FIG. 11 is a schematic diagram of a circuit for explaining the operation of the analog to digital converter of the Embodiment 3.

Next, the operation will be described. After the state shown in FIG. 9, the switches 28a to 28d are switched first and the switch 36 is opened as shown in FIG. 10. Then, switches 24a to 24d and a switch 34 are connected to the output of the second signal processing means 12. Further, as shown in FIG. 11, the switch 34 is opened so as to bring the node Vx1 into a floating state, and the switch 24d is connected to the output of the first signal processing means 10. Then, the potential of the node Vx1 rises from the first standard voltage Vref1 by ⅛ of the potential difference between the second standard voltage Vref2 and the first standard voltage Vref1. Analog to digital conversion of lower bits is performed by utilizing the voltage at the node Vx1.

Since the switch 38 in the Embodiment 2 becomes unnecessary with the foregoing, it is possible to dissolve an offset error due to field through charges generated with this switch. Further, it is not required to provide the third standard charge for analog to digital conversion of lower bits, but the circuit configuration can be simplified.

<Embodiment 4>

Figure 12:
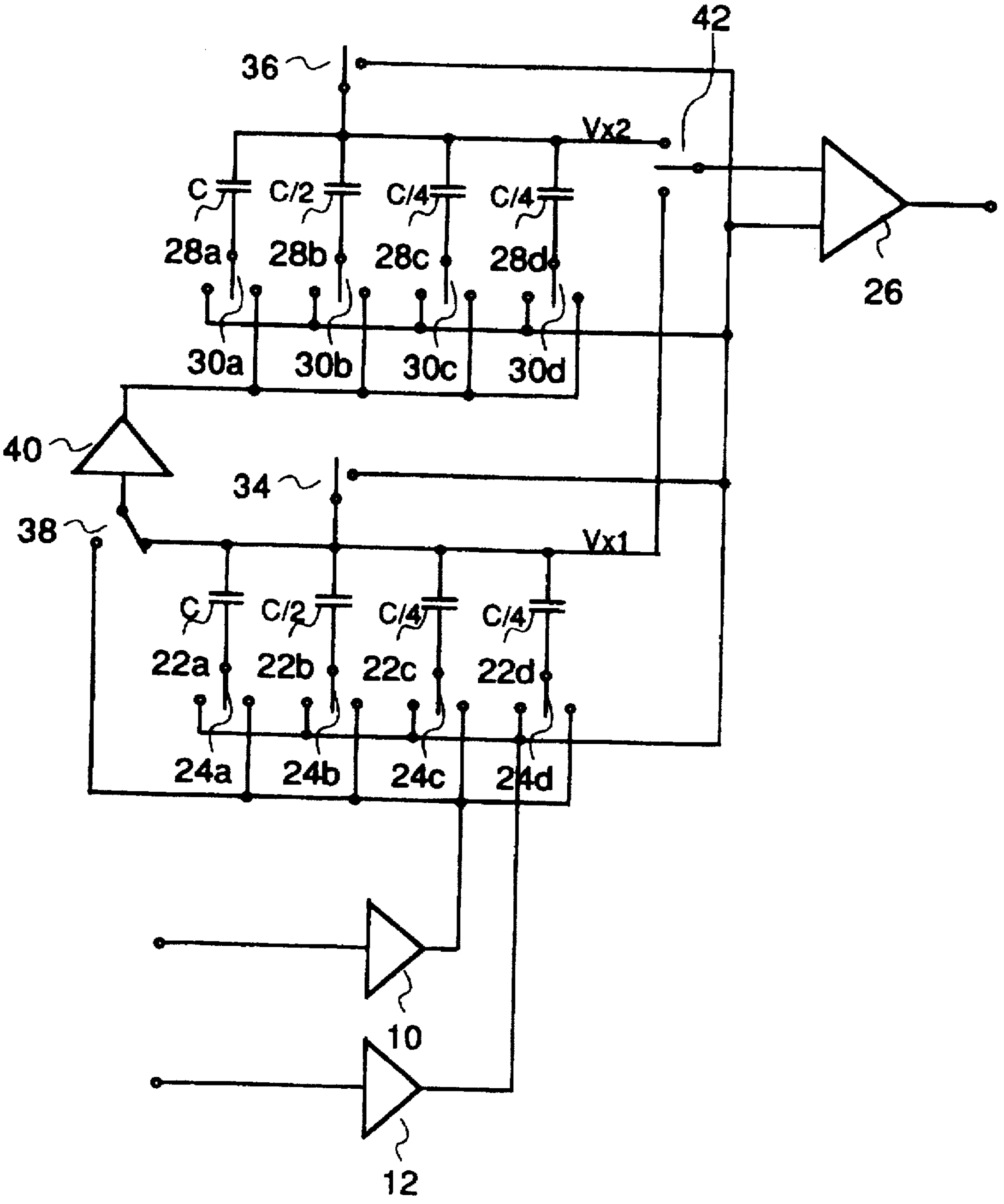
FIG. 12 is a schematic diagram of a circuit for explaining the operation of an analog to digital converter of Embodiment 4.

The present embodiment is featured by that voltage comparison in analog to digital conversion of lower bits in the Embodiment 2 is made using a voltage comparison means 26 for upper bits. Therefore, as shown in FIG. 12, a switch 42 for switching the node Vx1 to and from the node Vx2 is provided.

Next, the operation will be described. First, the switch 42 is connected to the node Vx1, and then analog to digital conversion of upper bits is performed in the same procedure as the Embodiment 2. Then, the switch 42 is switched to the node Vx2 thereby to perform analog to digital conversion of lower bits.

With this, it is possible to reduce the number of voltage comparison means and to simplify the circuit configuration.

<Embodiment 5>

Figure 13:
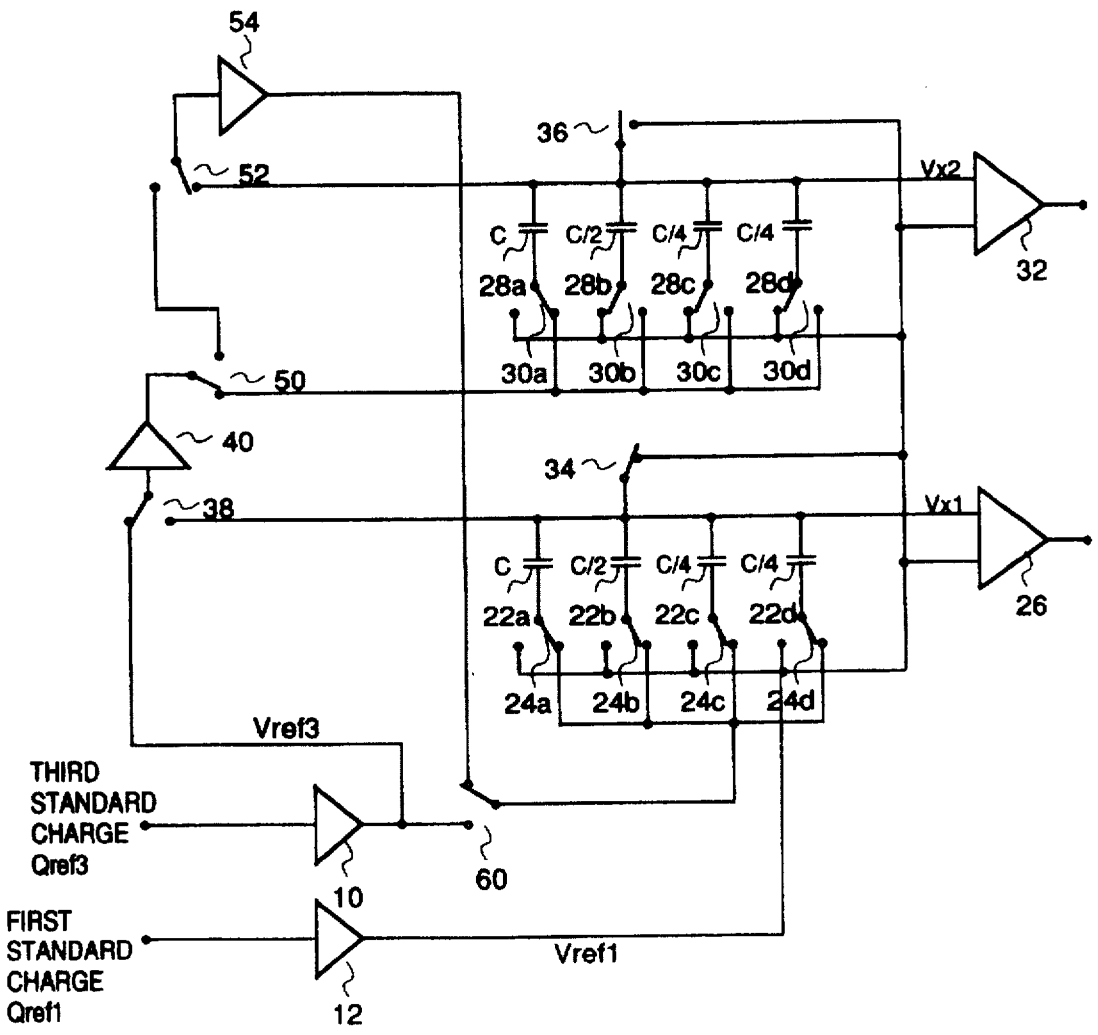
FIG. 13 is a schematic diagram of a circuit for explaining the operation of an analog to digital converter of Embodiment 5.

The present embodiment is featured by that the whole capacity value is reduced by utilizing one set of capacitor array a plurality of times. A configuration when analog to digital conversion in 9 bits is performed using two sets of capacitor arrays in three bits will be described with reference to FIG. 13. Here, 54 represents a buffer, and 50, 52 and 60 represent switches. In the present embodiment, analog to digital conversion data in 9 bits are obtained by executing analog to digital .conversion in three bits three times for upper bits, intermediate bits and lower bits.

Figure 14:
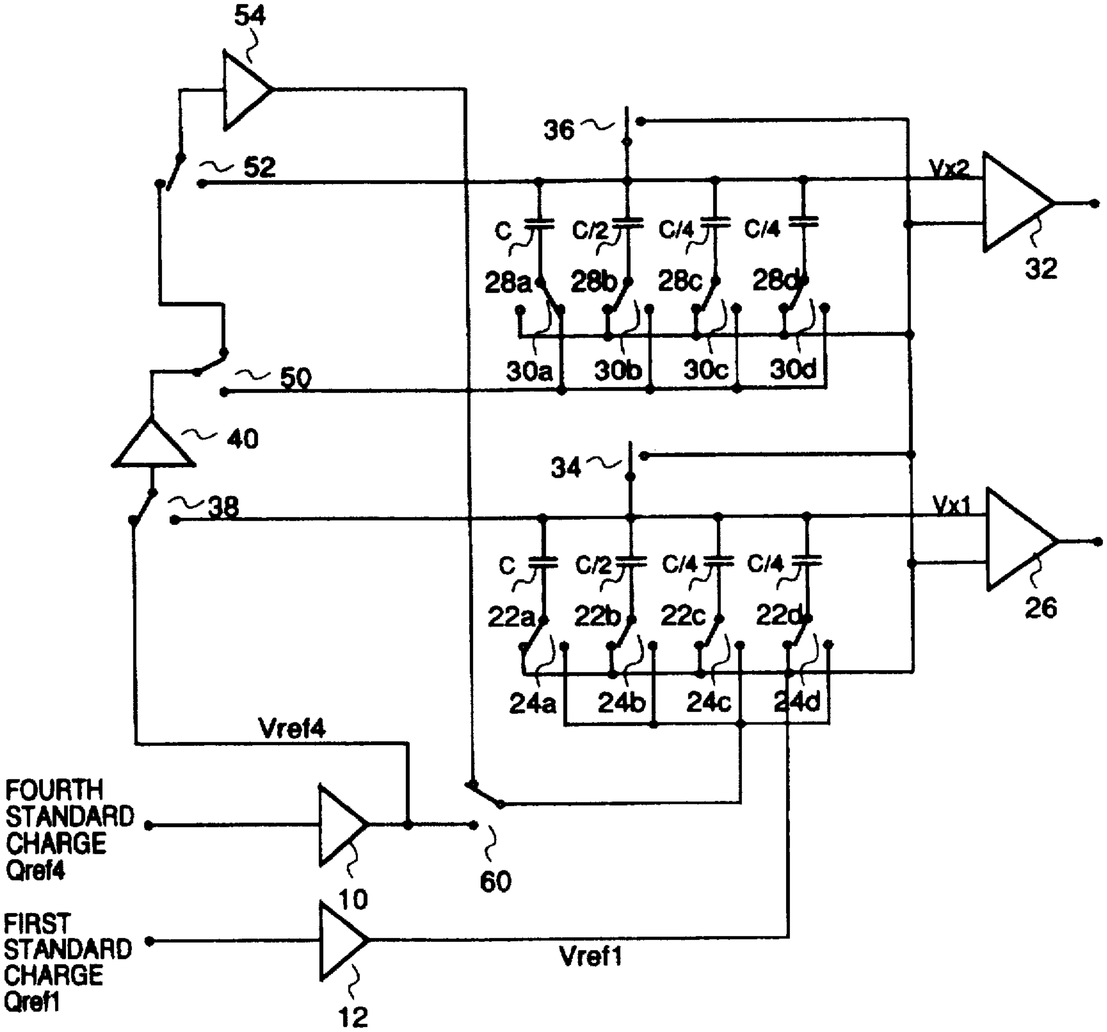
FIG. 14 is a schematic diagram of a circuit for explaining the operation of the analog to digital converter of the Embodiment 5.

First, analog to digital conversion of three upper bits and three intermediate bits is performed in a similar manner as the Embodiment 2. The potential of the node Vx2 at this point of time is charged to the capacitor array 22a to 22d for upper bits. Next, as shown in FIG. 14, the switches 50 and 52 are switched, and fourth standard charge Qref4 for lower bit conversion is inputted to the input of the first signal processing means 10. Then, fourth standard voltage Vref4 generated at the output of the first signal processing means 10 is transmitted through that which is the same as an amplifier where signal voltage inputted to the capacitor array 22a to 22d has passed.

Accordingly, no analog to digital conversion error is generated even if characteristics of the amplifier vary, thus making analog to digital conversion of multibits possible with a small capacity value.

A case in which analog to digital conversion in 9 bits is performed using two sets of 3-bit capacitor arrays has been described in the present embodiment, but a plurality sets of the number of bits and capacitor arrays for analog to digital conversion using this principle can be considered.

<Embodiment 6>

Figure 15:
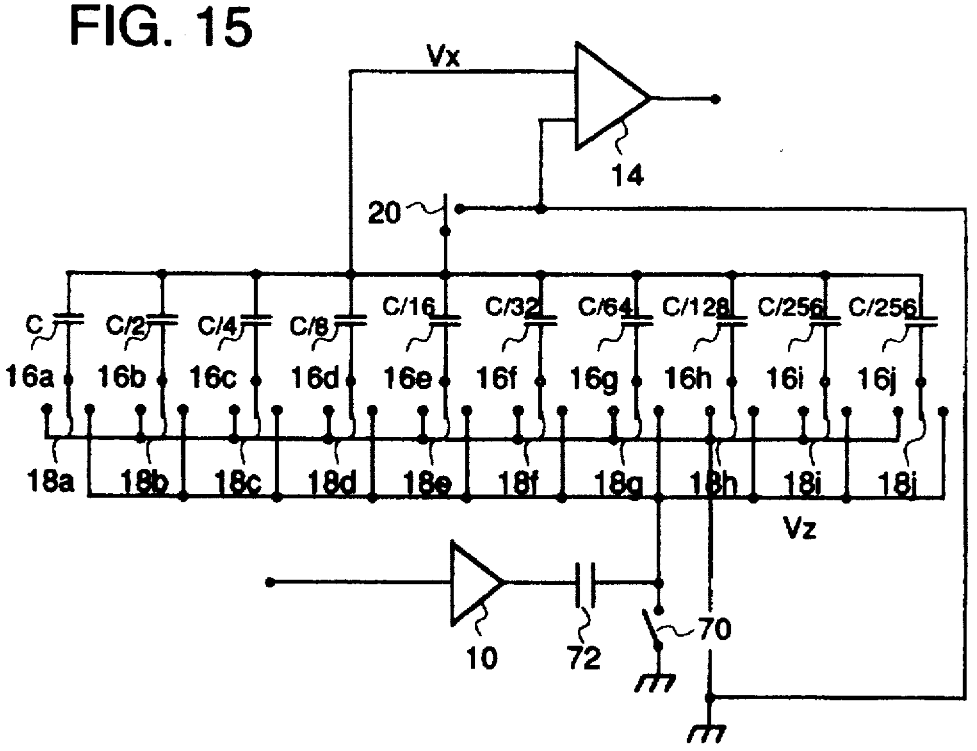
FIG. 15 is a schematic diagram of a circuit for explaining the operation of an analog to digital converter of Embodiment 6.

In the present embodiment, the second signal processing means 12 in the Embodiment 1 is deleted, and the output point of the second signal processing means 12 is grounded. Further, a capacitor 72 is inserted in the output of the first signal processing means 10, and a switch 70 with the grounded point is provided. This configuration is shown in FIG. 15.

Next, the operation will be described. First, the switch 70 is closed in a state that no signal is inputted to the input of the first signal processing means 10. Then, a node Vz is set to ground potential. Next, the switch 70 is opened, and signal voltage is inputted to the input of the first signal processing means 10. As a result, the voltage at the node Vz is changed by the change portion of the output of the first signal processing means 10. Thus, the voltage is changed at the node Vz with ground potential as the standard. In a word, when ground potential is given as standard voltage for one terminal of the voltage comparison means 14 and the analog to digital converter, analog to digital conversion becomes possible by a procedure similar to that of the Embodiment 1.

The number of signal processing means is reduced by using the first signal processing means 10 also as the second signal processing means 12, thereby to make it possible to simplify the circuit configuration. Further, since only one signal processing means is used, it is possible to make an analog to digital conversion error smaller. Moreover, it is sufficient to use only one type of standard charge in analog to digital conversion.

In the present embodiment, a case that one terminal of the voltage comparison means 14 is connected to ground has been described. However, the voltage at this terminal may be optional voltage. By using the voltage supplied within the system, it is not required to newly generate voltage, but the system can be composed of a simple circuit.

<Embodiment 7>

Figure 16:
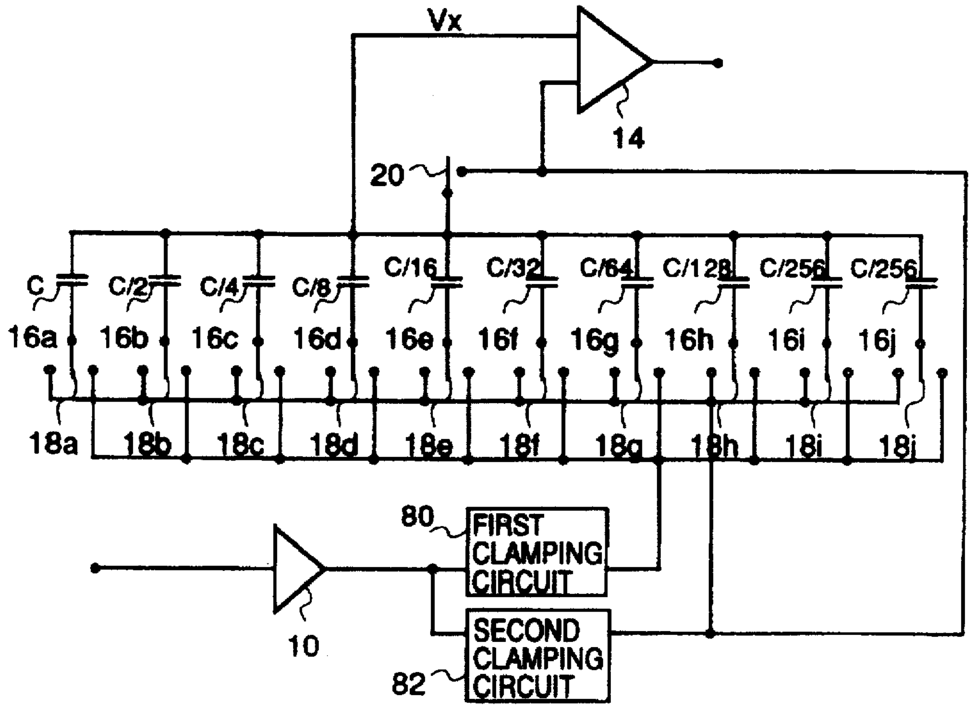
FIG. 16 is a schematic diagram of a circuit for explaining the operation of an analog to digital converter of Embodiment 7.

Embodiment 7 will be described with reference to FIG. 16. In the present embodiment, a first voltage holding means 80 and a second voltage holding means 82 are provided in the output of the first signal processing means 10. Further, the output when the first standard charge is inputted to the first signal processing means 10 is held in the second voltage holding means 82.

Next, the output when the signal charge is inputted to the first signal processing means 10 is held in the first voltage holding means 80. Then, the capacitor array 22a to 22d for higher bits is charged in a similar manner as the Embodiment 1. Next, the second standard charge is inputted to the first signal processing means 10, and the output thereof is held in the first voltage holding means 80. The switches 18a to 18j are switched in this state, and comparing operation is started. The operation thereafter is similar to that in the Embodiment 1.

The number of signal processing means is reduced by using the first signal processing means 10 also as the second signal processing means 12, thus making it possible to simplify the circuit configuration. Further, since only one signal processing means is used, it is possible to make an analog to digital conversion error smaller.

<Embodiment 8>

Figure 17:
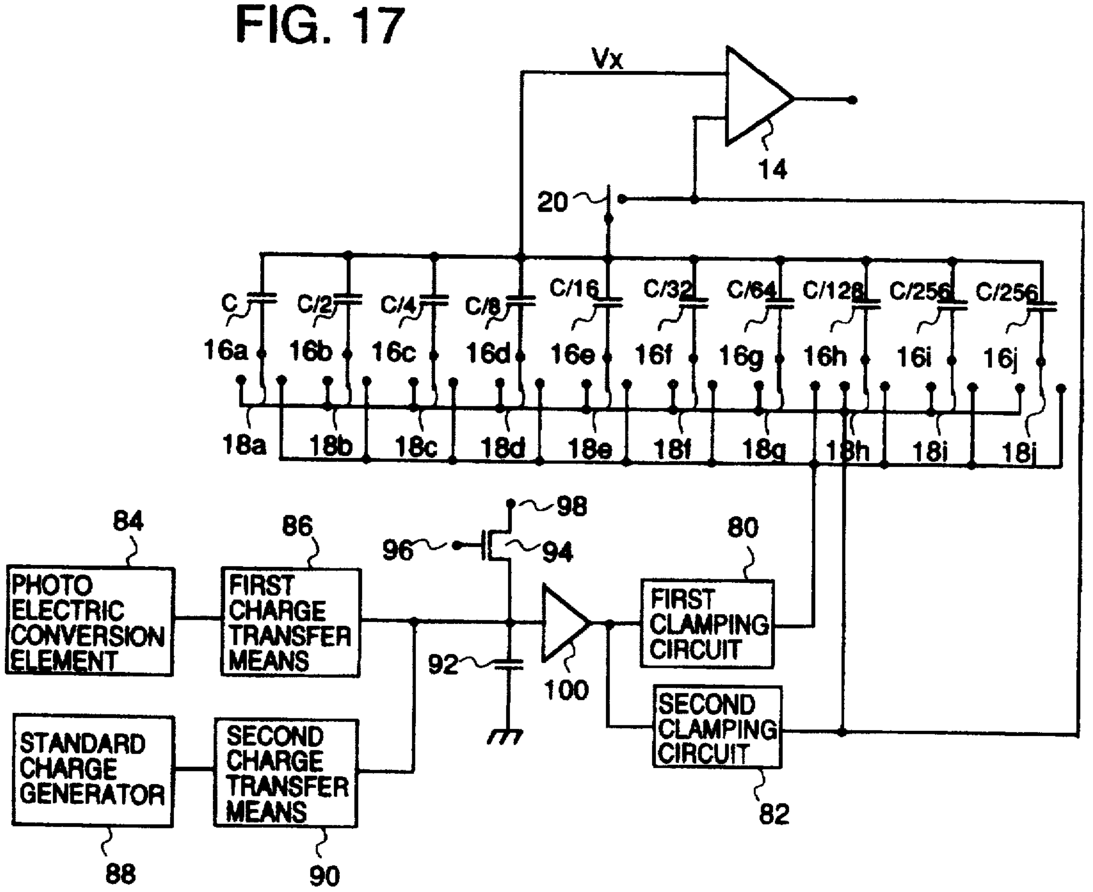
FIG. 17 is a schematic diagram for explaining the operation of an image sensor of Embodiment 8.

Next, an embodiment in which the present invention is applied to a line sensor will be described with reference to FIG. 17. Here, 84 represents a photoelectric conversion means, 86 a first charge transfer means, 88 a standard charge generating means, 90 a second charge transfer means, 92 an input capacitor, 94 a reset transistor, 96 a gate terminal of the reset transistor, 98 a drain terminal of the reset transistor and 100 a voltage amplification means.

Next, the operation will be described. First, the potential of the input capacitor 92 is reset by means of the reset transistor 94. The output of the voltage amplification means 100 at that time is held in the second voltage holding means 82. Next, the charge generated in the photoelectric conversion means 84 is transferred by the first charge transfer means 86 and inputted to the input capacity 92. Then, the output of the voltage amplification means 100 at that time is held in the first voltage holding means 80. The capacitor array 16*a* to 16*j* is charged in this state in a similar manner as the Embodiment 1. Next, the potential of the input capacitor 92 is reset once again by means of the reset transistor 94. Then, the standard charge generated by the standard charge generating means 88 is transferred using the second charge transfer means 90 and inputted to the input capacitor 92. Then, the output of the voltage amplification means 100 at this time is held in the first voltage holding means 80, and switches 18*a* to 18*j* are switched in a similar manner as the Embodiment 1, thus performing comparing operation.

With this, no analog to digital conversion error is generated even when characteristics of the voltage amplification means 100 vary.

The present embodiment has been described with respect to a case of one set of analog to digital converter, but the present invention is also effective when a plurality of analog to digital converters are provided so as to perform analog to digital conversion of signal charges in parallel. In this case, characteristic unevenness of the voltage amplification means 100 exists in every analog to digital converter. However, it is also possible to cancel such line unevenness by applying the present invention. Further, when only one standard charge generating means 88 is provided and standard charges generated there are supplied to all the lines through the charge transfer means at that time, it is also possible to delete unevenness of the standard voltage generating means in every line, thus making analog to digital conversion of higher precision possible.

Figure 20:
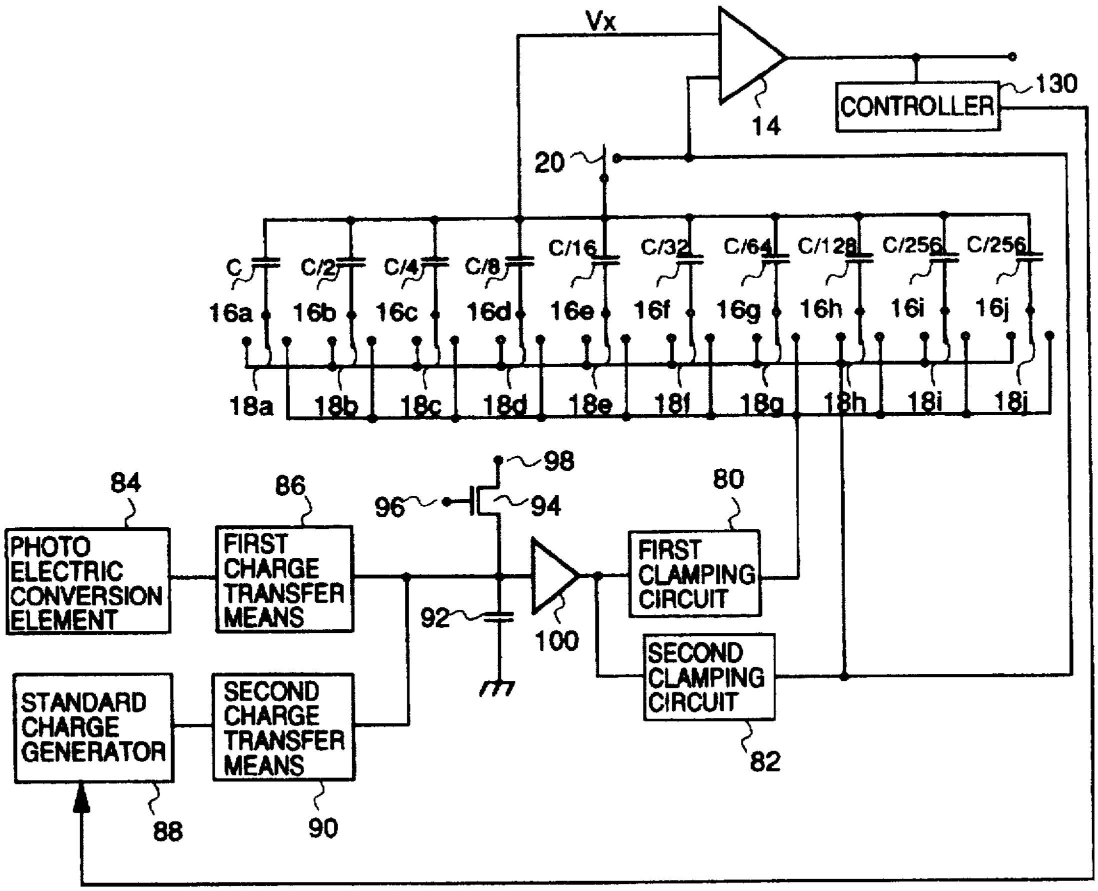
FIG. 20 is a schematic diagram of another image sensor according to the present invention.
Figure 21:
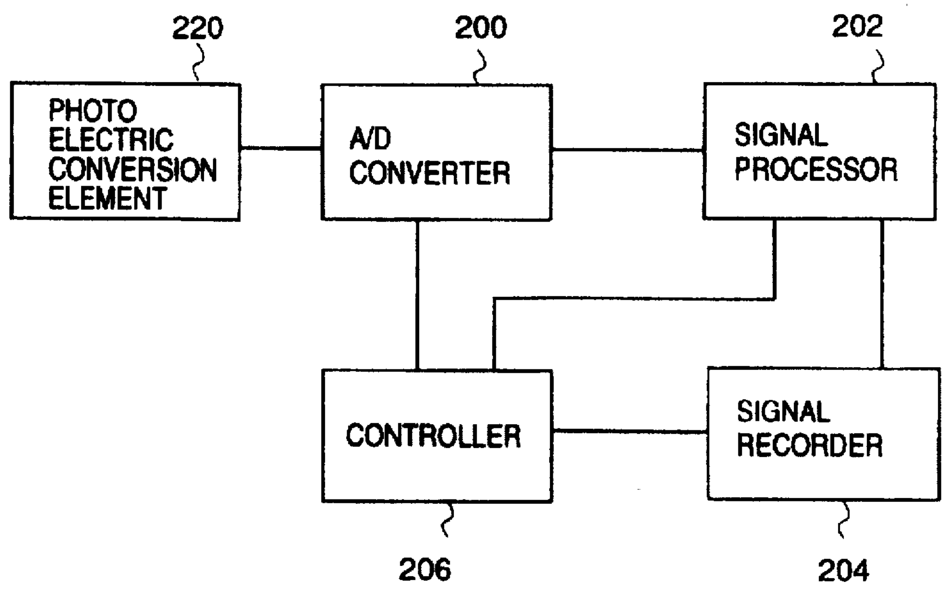
FIG. 21 is a schematic diagram of a device for explaining a VTR integrated camera of Embodiment 10.

Further, when the present embodiment is applied to a camera system or the like, it is also possible to change a conversion voltage range of analog to digital conversion adaptably in accordance with intensity of light. A block diagram in this case is shown in FIG. 20. For example, when the light of input is feeble, the output of analog to digital conversion also shows a small value. This analog to digital conversion output is determined by a control means 130, and is fedback to the standard charge generating means 88 so that the generation quantity of standard charge is reduced. With this, the generated standard voltage is reduced, and the conversion voltage range of analog to digital conversion is narrowed. Thus, it is possible to obtain the effect of automatic gain control.

<Embodiment 9>

Figure 18:
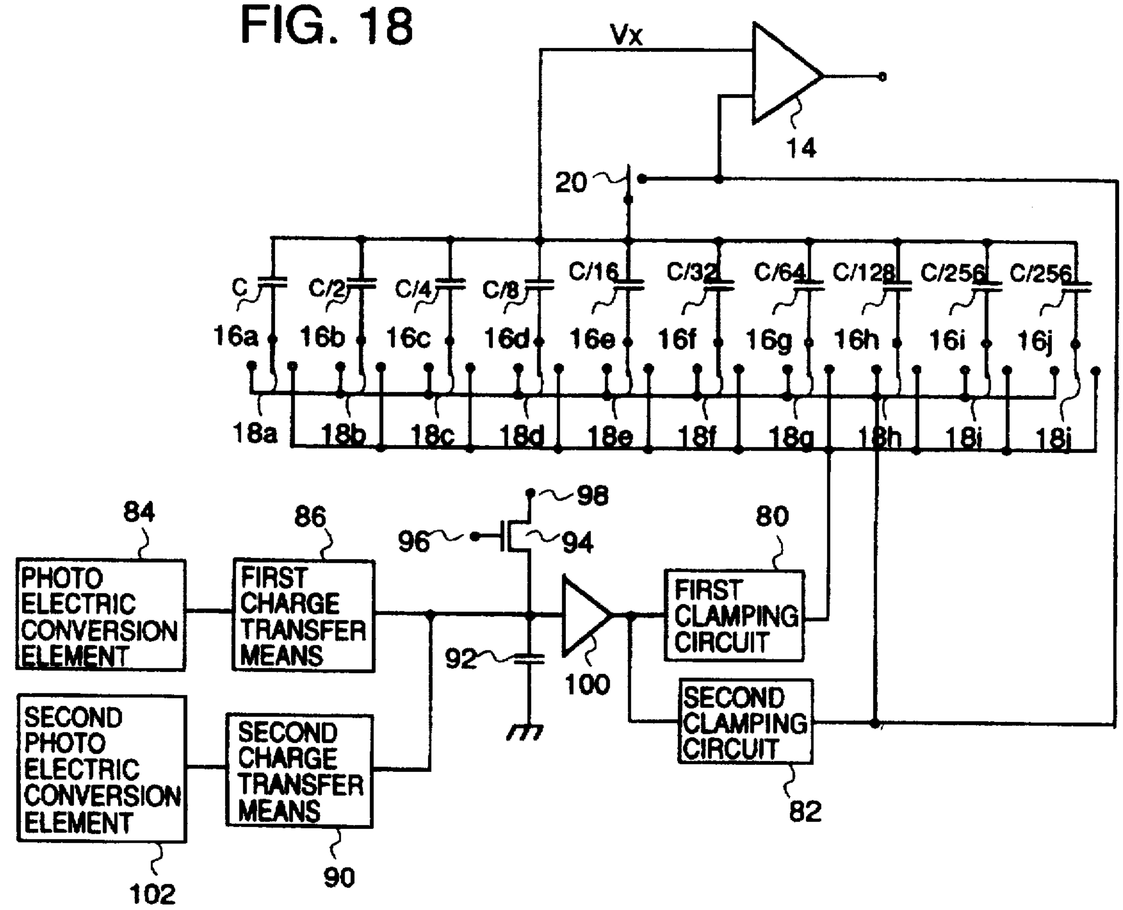
FIG. 18 is a schematic diagram for explaining the operation of the image sensor of the Embodiment 8.
Figure 19:
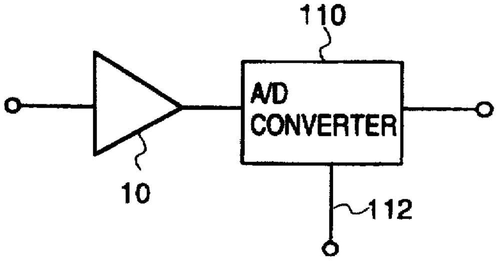
FIG. 19 is a schematic diagram of a circuit for explaining a conventional analog to digital converter.

The structure of the present embodiment is featured by that the standard charge generating means 88 in the Embodiment 8 (FIG. 17) is replaced with a second photoelectric conversion means 102 aS shown in FIG. 18. In the present embodiment, the second photo-electric conversion means 102 is irradiated with a standard light in place of generating the standard charge by the standard charge generating means 88 in the Embodiment 8. The charge thus generated is used as the standard charge. The other operations are the same as those in the Embodiment 8. According to the present embodiment, the standard charge generating means becomes unnecessary, thus making it possible to simplify the circuit.

<Embodiment 10>

In the present embodiment, a VTR-integrated camera is structured using the present invention. Here, 200 represents an analog to digital converter having a structure shown in FIG. 17 using the present invention, 220 represents a photoelectric conversion means, 202 represents a camera signal processing means, 204 represents a signal recording means, and 206 represents a camera control means.

A light signal that has been incident upon a camera is converted into an electric analog signal by the photoelectric conversion means 220. This analog signal is converted into a digital signal by the analog to digital converter 200 and inputted to the camera signal processing means 202. Here, the digital signal is processed into a signal required for the system. Then, when the signal is recorded, it is made by the signal recording means 204. Further, the control of the whole system is made by the camera control means 206.

With this, in a VTR-integrated camera using the present invention, it is not required to regulate the standard voltage of the analog to digital converter for each camera, but the number of components such as volumes can be reduced, and an inexpensive system can be constituted.

<Embodiment 11>

Figure 22:
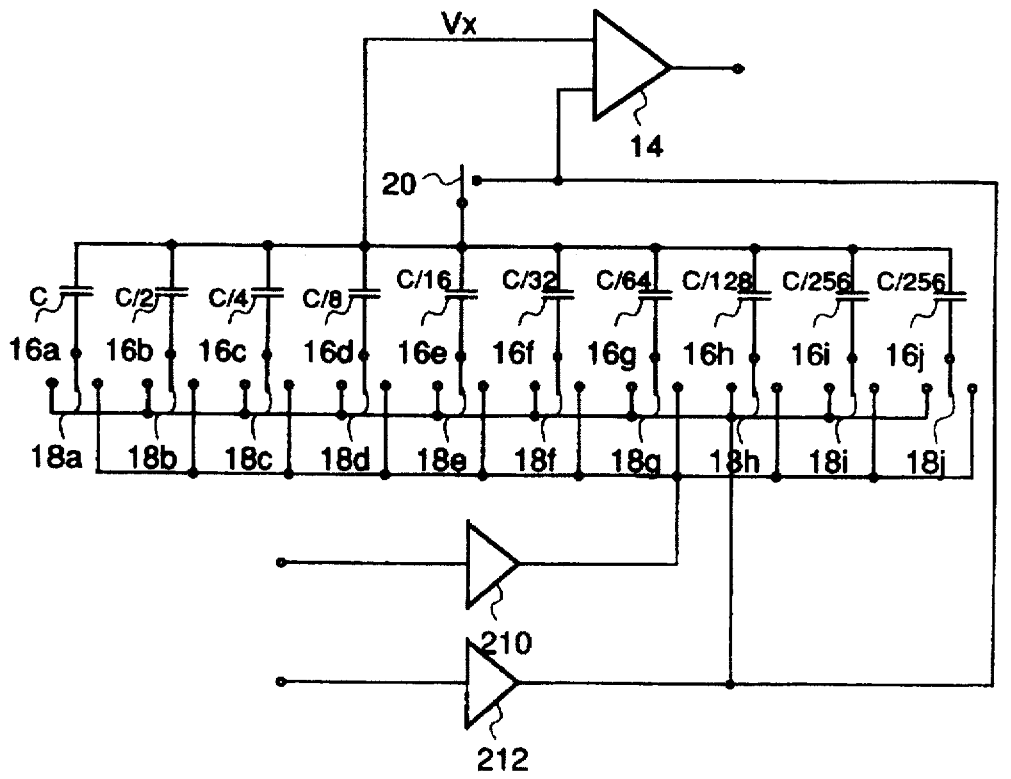
FIG. 22 is a schematic diagram of an analog to digital converter of Embodiment 11.

A case in which the first physical quantity is current and the second physical quantity is voltage will be described with reference to FIG. 22. Here, 210 represents a first signal processing means in which the input is current and the output is voltage, and 212 represents a second signal processing means in which the input is current and the output is voltage. Other than the foregoing, the structure is the same as that shown in FIG. 1. The operation is the same as the Embodiment 1 except that a first standard current Iref1 is used in place of the first standard charge Qref1 in the embodiment and a second standard current Iref2 is used in place of the second standard charge Qref2. with this, it is possible to perform analog to digital conversion of the signal current Isig.

As described above, when the present invention is adopted, the standard signal used in analog to digital conversion is generated by using a second signal amplification means having the same function as that of a first signal amplification means for amplifying an input signal of the analog to digital conversion means. Therefore, even when the amplification means varies for every chip, it is not required to regulate the standard voltage for every chip. Further, when a plurality of analog to digital conversion means are provided in the chip, it is also possible to cancel unevenness among respective amplification means.

What is claimed is:

1. An analog to digital converter having a first signal processing means for converting an input charge signal into a voltage and outputting an analog signal while providing gain to said input charge signal and an analog to digital conversion means for converting said analog signal into a digital signal using a second standard voltage signal, comprising a second signal processing means for converting a first standard charge signal as an input signal into a voltage while providing gain to said input signal and outputting said second standard signal as an output signal.

2. An analog to digital converter according to claim 1, wherein said analog to digital conversion means includes a charge reallocation type successive approximation means.

3. An analog to digital converter according to claim 2, wherein the charge reallocation type successive approximation means has a weighted first capacitor array dividing and storing charges comprising the input signal and means for performing analog to digital conversion by using said first capacitor array storing the charges.

4. An analog to digital converter according to claim 3, further comprising a second capacitor array.

5. An analog to digital converter according to claim 4, wherein storing for upper bits and storing for lower bits are provided by said first and second capacitor arrays respectively, and said second standard voltage signal for said lower bits is generated using said first capacitor array for upper bits.

6. An analog to digital converter according to claim 4, wherein outputs of said first and second capacitor arrays are compared with one another by means of a voltage comparison means.

7. An analog to digital converter according to claim 4, wherein analog to digital conversion is performed by using said first capacitor array for upper bits a plurality of times.

8. An analog to digital converter according to any of claim 1, further comprising a first standard charge signal generating means for generating said first standard signal.

9. An analog to digital converter according to claim 8, further comprising control means for controlling said first standard signal generating means in accordance with the output from said analog to digital conversion means.

10. An analog to digital converter according to claim 1, wherein said first standard charge signal is generated by irradiating a photoelectric transducer with a standard light.

11. An analog to digital converter according to claim 1, wherein said first and second signal processing means are the same units and used by a time sharing system.

12. An analog to digital converter according to claim 1 wherein the input signal of said first signal processing means is charge generated by a photoelectric conversion means.

13. An analog to digital converter according to claim 1 wherein a plurality of sets of said analog to digital conversion means are provided.

14. An analog to digital converter according to claim 13, wherein one common first standard charge signal is inputted to a plurality of said second signal processing means provided within said plurality of analog to digital conversion means.

15. A signal conversion apparatus characterized in that, in a photoelectric conversion apparatus having a photoelectric transducer group, means for transferring a charge group of input signals generated in said photoelectric transducer group and a plurality of analog to digital converters for performing analog to digital conversion of said transferred charge group are provided, wherein each of said analog to digital converters comprises:

a first signal processing means for converting said charge into voltage, amplifying the input signal and outputting an analog signal;

an analog to digital conversion means for converting said analog signal into a digital signal using a standard voltage signal; and a second signal processing means for converting a standard charge signal as a second input signal into a voltage, amplifying said second input signal and outputting said standard voltage signal as an output signal.

16. A signal conversion apparatus comprising:

an analog to digital converter for performing analog to digital conversion of a input signal comprised of a charge generated by an input light to provide a voltage signal;

a camera signal processing means for processing the voltage signal;

a signal recording means for recording a signal processed by said camera signal processing means; and a camera control means for controlling said analog to digital converter, said camera signal processing means and said signal recording means; wherein said analog to digital converter includes:

a first signal processing means for converting said charge into voltage, amplifying said input signal and outputting an analog signal;

an analog to digital conversion means for converting said analog signal into a digital signal using a standard voltage signal; and a second signal processing means for converting a standard charge signal as a second input signal into a voltage, amplifying said second input signal and outputting said standard voltage signal an output signal.

17. A signal conversion apparatus according to claim 15, wherein said first and second signal processing means are the same units and are used by a time sharing system.

18. A signal conversion apparatus according to claim 16, wherein said first and second signal processing means are the same units and are used by a time sharing system.

* * * * *